United States Patent
Sasaki et al.

(10) Patent No.: US 8,754,726 B2
(45) Date of Patent: Jun. 17, 2014

(54) MULTILAYER BAND-PASS FILTER

(75) Inventors: Hiroyuki Sasaki, Nagaokakyo (JP);
Hiroshi Masuda, Nagaokakyo (JP);
Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 306 days.

(21) Appl. No.: 13/193,649

(22) Filed: Jul. 29, 2011

(65) Prior Publication Data
US 2012/0119852 A1 May 17, 2012

(30) Foreign Application Priority Data

Nov. 11, 2010 (JP) .................................. 2010-253214
Jul. 8, 2011 (JP) .................................. 2011-151479

(51) Int. Cl.
*H01P 3/08* (2006.01)
*H01P 5/12* (2006.01)

(52) U.S. Cl.
USPC ............................ 333/204; 333/134; 333/185

(58) Field of Classification Search
USPC .................................. 333/134, 185, 204, 219
See application file for complete search history.

(56) References Cited

U.S. PATENT DOCUMENTS 7,126,444 B2 * 10/2006 Fukunaga et al. ............. 333/204
7,432,786 B2 * 10/2008 Tomaki et al. ................. 333/204
8,482,365 B2 * 7/2013 Taniguchi ...................... 333/175

FOREIGN PATENT DOCUMENTS

EP          2 009 787 A1      12/2008
JP          2006-067221 A      3/2006
WO        2007/119356 A1     10/2007

* cited by examiner

*Primary Examiner* — Robert Pascal
*Assistant Examiner* — Kimberly Glenn
(74) *Attorney, Agent, or Firm* — Keating & Bennett, LLP (57) ABSTRACT

In a multilayer band-pass filter, each of first-stage to third-stage LC parallel resonators includes capacitor electrodes, via electrodes, and a line electrode. Jump-coupling capacitor electrodes face the capacitor electrodes of the first-stage and third-stage LC parallel resonators. The direction in which the inductor electrode extends from the capacitor electrodes of each of the first-stage and third-stage LC parallel resonators is opposite to the direction in which the inductor electrode extends from the capacitor electrodes of the second-stage LC parallel resonator.

6 Claims, 12 Drawing Sheets

MULTILAYER BAND-PASS FILTER

BACKGROUND OF THE INVENTION

1. Field of the Invention

The present invention relates to a multilayer filter that includes a plurality of LC parallel resonators including inductors having a loop shape and capacitor electrodes.

2. Description of the Related Art

A typical radio-frequency band-pass filter suited for miniaturization and low cost of manufacturing is configured such that a plurality of LC resonators is disposed in a laminate of dielectric layers and electrode layers.

Examples of such a multilayer band-pass filter are disclosed in Japanese Unexamined Patent Application Publication No. 2006-67221 and International Publication No. WO 2007-119356.

Japanese Unexamined Patent Application Publication No. 2006-67221 discloses a three-stage multilayer filter in which the first-stage and third-stage resonators are jump-coupled by a coupling capacitor C3, as illustrated in FIG. 1 thereof. The jump-coupling capacitor C3 is configured such that an electrode pattern 151 forming an inductor L1 and an electrode pattern 153 forming an inductor L3 face an electrode pattern 161, as illustrated in FIG. 3 thereof.

However, with the configuration described above, because the electrode pattern 161 also faces an electrode pattern 152 forming an inductor L2, unnecessary parasitic capacitance occurs between the electrode pattern 161 and the electrode pattern 152. Therefore, there is a problem in that Q of the filter decreases and attenuation characteristics deteriorate.

International Publication No. WO 2007-119356 discloses a configuration in which parasitic capacitance between an electrode pattern of a jump-coupling capacitor and a capacitance electrode pattern of a resonator that is not coupled to the electrode pattern of the jump-coupling capacitor is reduced.

Figure 1:
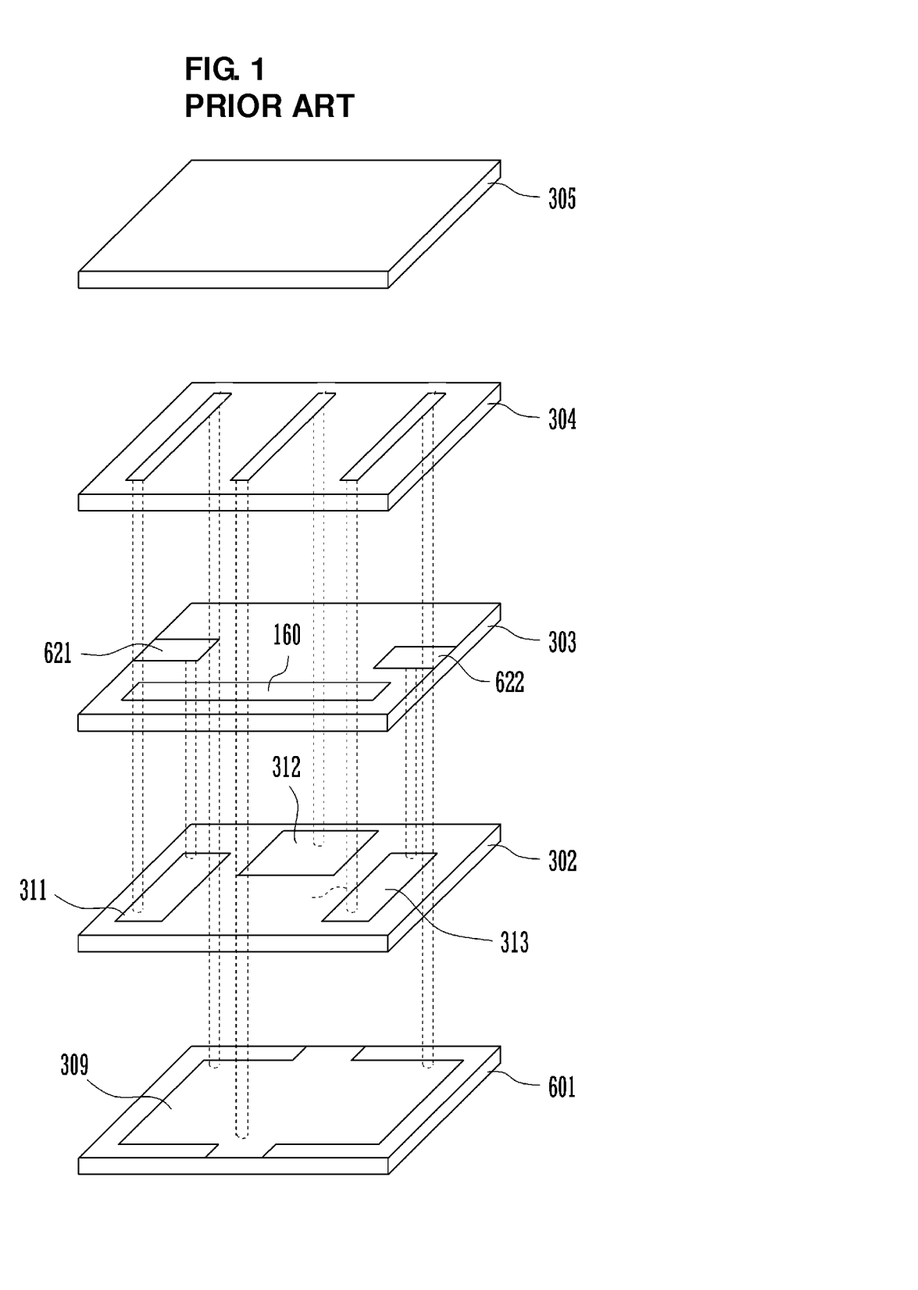
FIG. 1 is an exploded perspective view of a traditional multilayer band-pass filter.

FIG. 1 illustrates a configuration of a multilayer band-pass filter disclosed in WO 2007-119356. The multilayer band-pass filter illustrated in FIG. 1 includes a laminate including a ground electrode forming layer 601, a capacitor electrode forming layer 302, an input and output electrode forming layer 303, a line electrode forming layer 304, and an outer layer 305. Input and output electrodes 621 and 622 and an input-output intermediate capacitor electrode (electrode pattern of a jump-coupling capacitor) 160 are disposed on the input and output electrode forming layer 303. The input-output intermediate capacitor electrode 160 capacitively couples the input and output electrodes 621 and 622 by causing capacitance to occur between the input and output electrodes 621 and 622. Capacitor electrodes 311, 312, and 313 on the capacitor electrode forming layer 302 face a ground electrode 309.

To reduce parasitic capacitance between the input-output intermediate capacitor electrode (electrode pattern of a jump-coupling capacitor) 160 and the capacitor electrode 312 of the second-stage resonator, the capacitor electrode of the second-stage resonator is displaced from the capacitor electrodes of the first-stage and third-stage resonators in the plane direction of the laminate.

With the structure illustrated in FIG. 1, because the capacitor electrode of the second-stage resonator does not overlap the jump-coupling capacitor electrode when viewed from the direction in which the dielectric layers are laminated, the parasitic capacitance therebetween can be reduced.

However, the displacement of a capacitor electrode of a resonator in the layer direction (plane direction) increases the size of an area required for formation of capacitor electrodes, and there is a problem in that miniaturization of the device is difficult.

SUMMARY OF THE INVENTION

Accordingly, preferred embodiments of the present invention provide a multilayer band-pass filter having a significantly reduced overall size while preventing unnecessary parasitic capacitance between a jump-coupling capacitor electrode and a capacitor electrode of an LC parallel resonator that is not related to jump-coupling.

According to a preferred embodiment of the present invention, a multilayer band-pass filter includes a laminate including a plurality of dielectric layers and a plurality of electrode layers, a plurality of LC parallel resonators more than two, and a jump-coupling capacitor electrode. Each of the plurality of LC parallel resonators includes a first capacitor electrode, a second capacitor electrode, and a loop-shaped inductor electrode disposed on the plurality of electrode layers. The inductor electrode includes a first end connected to the first capacitor electrode and a second end connected to the second capacitor electrode, the first end defining a starting point and the second end defining an ending point. The inductor electrode includes a line electrode disposed along any one of the dielectric layers and a via electrode extending in a direction in which the dielectric layers are laminated. The plurality of LC parallel resonators includes a first first-type LC parallel resonator, a second first-type LC parallel resonator, and at least one second-type LC parallel resonator disposed between the first first-type LC parallel resonator and the second first-type LC parallel resonator. The jump-coupling capacitor electrode is disposed on any one of the plurality of electrode layers and configured to couple the first first-type LC parallel resonator and the second first-type LC parallel resonator. The jump-coupling capacitor electrode faces the first capacitor electrode and the second capacitor electrode of each of the first first-type LC parallel resonator and the second first-type LC parallel resonator. A direction in which the inductor electrode extends from the capacitor electrodes of each of the first-type LC parallel resonators is opposite to a direction in which the inductor electrode extends from the capacitor electrodes of the second-type LC parallel resonator.

With this configuration, parasitic capacitance between a jump-coupling capacitor electrode and an LC parallel resonator that is not jump-coupled is reduced and minimized while the overall size of the device is greatly reduced.

For example, when viewed in a direction in which the plurality of LC parallel resonators are arranged, loop surfaces of the inductor electrodes of the plurality of LC parallel resonators may at least partially overlap each other. With this structure, magnetic coupling between the LC parallel resonators is adjustable.

The first first-type LC parallel resonator may preferably be connected to an unbalanced input and output electrode, and the second first-type LC parallel resonator may preferably be connected to a balanced input and output electrode.

The multilayer band-pass filter may further include an impedance-matching inductor electrode disposed on any one of the plurality of electrode layers. The second first-type LC parallel resonator and the balanced input and output electrode may be connected to each other with the impedance-matching inductor electrode disposed therebetween. Te impedance-matching inductor electrode may be disposed on a layer that is different from a layer on which the second-type LC parallel resonator is disposed.

With this configuration, if impedance conversion is needed, for example, if a filter that requires balanced-unbalanced transforming is used, an impedance-matching circuit can be easily provided without affecting M (mutual induction) coupling between the LC parallel resonators.

The laminate may further include a ground electrode that is substantially parallel with the direction in which the dielectric layers are laminated and substantially parallel with a mounting surface, and the loop surfaces of the plurality of LC parallel resonators may face the ground electrode substantially in parallel therewith, for example.

With this configuration, because the inductor electrodes have substantially the same distance to the ground electrode being substantially parallel with the mounting surface, the impedance of each inductor can be easily designed, and stable characteristics are obtainable.

With preferred embodiments of the present invention, because there is no need to widen each of the jump-coupling capacitor electrode and the LC parallel resonators in the layer direction, the entire filter size is not increased, unnecessary parasitic capacitance between the jump-coupling capacitor electrode and a capacitor electrode of a resonator that is not related to the jump-coupling is prevented, and the small multilayer band-pass filter achieving excellent filter characteristics is obtainable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A multilayer band-pass filter according to a first preferred embodiment is described with reference to FIGS. 2 to 5B.

Figure 2:
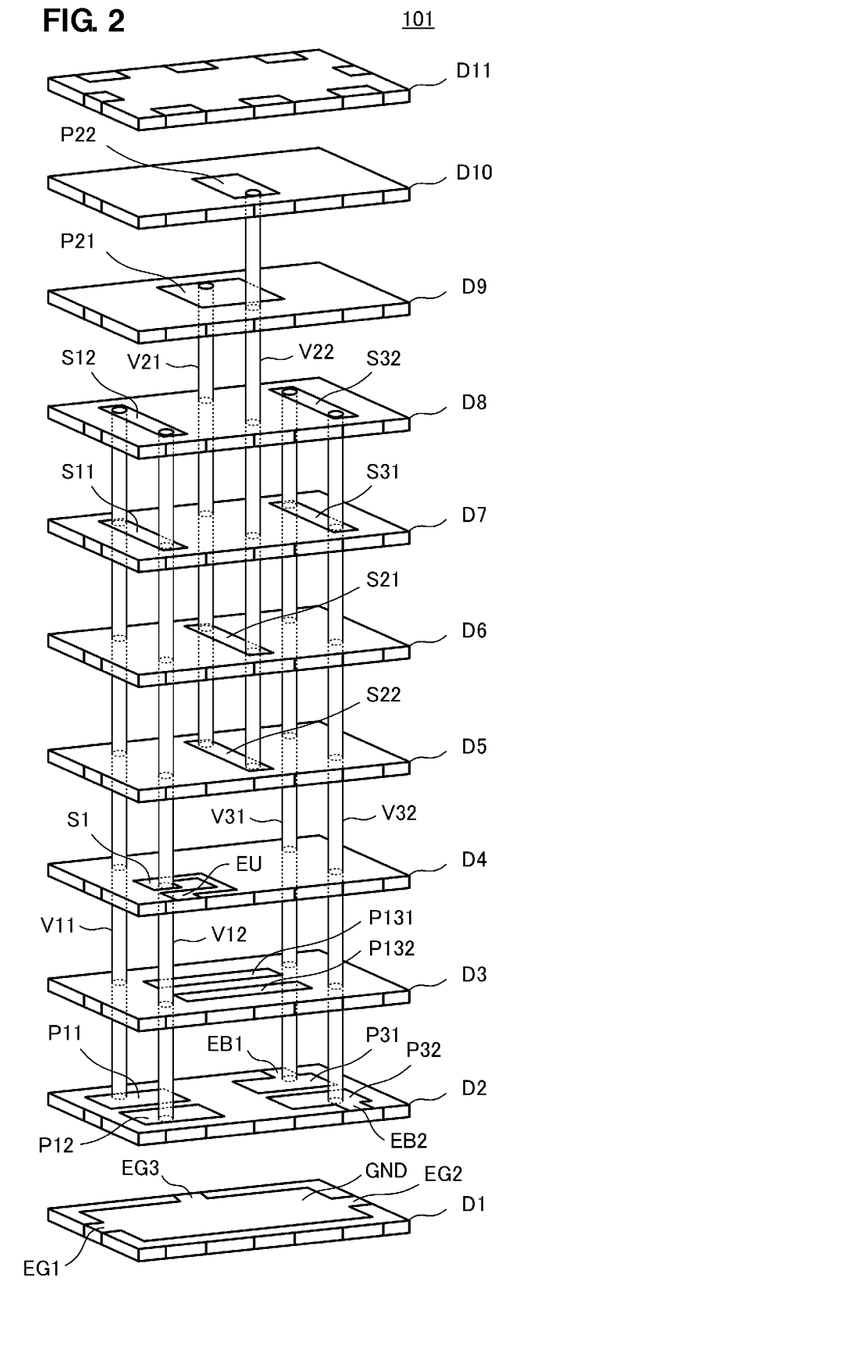
FIG. 2 is an exploded perspective view of a multilayer band-pass filter according to a first preferred embodiment of the present invention.

FIG. 2 is an exploded perspective view of a multilayer band-pass filter 101 according to the first preferred embodiment.

Figure 3:
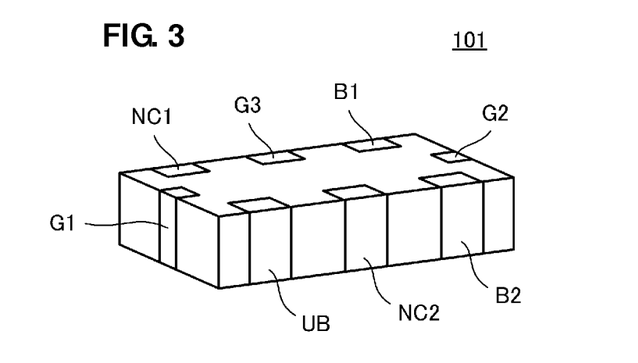
FIG. 3 is an external perspective view of the multilayer band-pass filter according to the first preferred embodiment of the present invention.
Figure 4:
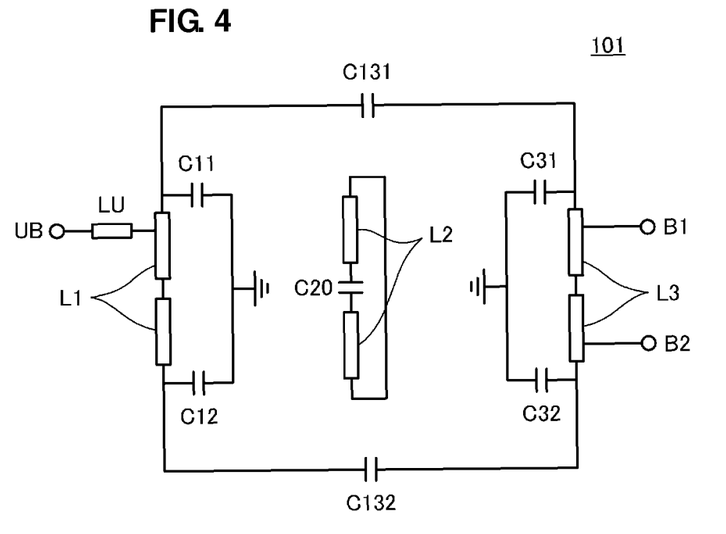
FIG. 4 is an equivalent circuit diagram of the multilayer band-pass filter according to the first preferred embodiment of the present invention.

FIG. 3 is an external perspective view of the multilayer band-pass filter 101. FIG. 4 is an equivalent circuit diagram of the multilayer band-pass filter 101.

First, a configuration of the multilayer band-pass filter 101 according to the first preferred embodiment based on its equivalent circuit is described with reference to FIG. 4. The multilayer band-pass filter 101 preferably is a band-pass filter that includes an unbalanced terminal UB and balanced terminals B1 and B2 and has the balanced-unbalanced transforming function. For the present preferred embodiment, the LC parallel resonator connected to the unbalanced terminal UB is defined as a first-stage LC parallel resonator, the LC parallel resonator connected to the balanced terminals B1 and B2 is defined as a third-stage LC parallel resonator, and the LC parallel resonator between the first-stage and third-stage LC parallel resonators is defined as a second-stage LC parallel resonator.

The first-stage LC parallel resonator includes an inductor L1 and capacitors C11 and C12. Similarly, the second-stage LC parallel resonator includes an inductor L2 and a capacitor C20, and the third-stage LC parallel resonator includes an inductor L3 and capacitors C31 and C32. As described below, the first-stage LC parallel resonator and the second-stage LC parallel resonator are coupled together, and the second-stage LC parallel resonator and the third-stage LC parallel resonator are coupled together.

As illustrated in FIG. 2, the multilayer band-pass filter 101 preferably is a laminate of a plurality of dielectric layers D1 to D11. A ground electrode GND is disposed on the upper surface of the dielectric layer D1. A first capacitor electrode P11 and a second capacitor electrode P12 of the first-stage LC parallel resonator and a first capacitor electrode P31 and a second capacitor electrode P32 of the third-stage LC parallel resonator are disposed on the upper surface of the dielectric layer D2.

Jump-coupling capacitor electrodes P131 and P132 are disposed on the upper surface of the dielectric layer D3. An inductor electrode S1 to provide matching at the unbalanced side is disposed on the upper surface of the dielectric layer D4. Line electrodes S22 and S21 of the second-stage LC parallel resonator are disposed on the upper surfaces of the dielectric layers D5 and D6, respectively. Line electrodes S11 and S12 of the first-stage LC parallel resonator are disposed on the upper surfaces of the dielectric layers D7 and D8, respectively. Similarly, line electrodes S31 and S32 of the third-stage LC parallel resonator are disposed on the upper surfaces of the dielectric layers D7 and D8, respectively. A first capacitor electrode P21 and a second capacitor electrode P22 of the second-stage LC parallel resonator are disposed on the upper surfaces of the dielectric layers D9 and D10, respectively.

Via electrodes V11, V12, V31, and V32 extend along the direction in which the dielectric layers D3 to D8 are laminated. A via electrode V21 extends along the direction in which the dielectric layers D6 to D9 are laminated. A via electrode V22 extends along the direction in which the dielectric layers D6 to D10 are laminated.

The via electrode V11 extends from a first end of the line electrode S12 to the capacitor electrode P11. The via electrode V12 extends from a second end of the line electrode S12 to the capacitor electrode P12. The line electrode S11 is on a layer adjacent to the line electrode S12 and is connected to the line electrode S12 substantially in parallel therewith through the via electrodes V11 and V12 disposed therebetween. The inductor electrode of the first-stage LC parallel resonator is configured in a loop shape by including the via electrodes V11 and V12 and the line electrodes S11 and S12.

The via electrode V21 extends from a first end of the line electrode S22 to the capacitor electrode P21. The via electrode V22 extends from a second end of the line electrode S22 to the capacitor electrode P22. The line electrode S21 is on a layer adjacent to the line electrode S22 and is connected to the line electrode S22 substantially in parallel therewith through the via electrodes V21 and V22 disposed therebetween. The inductor electrode of the second-stage LC parallel resonator is configured in a loop shape by including the via electrodes V21 and V22 and the line electrodes S21 and S22.

The via electrode V31 extends from a first end of the line electrode S32 to the capacitor electrode P31. The via electrode V32 extends from a second end of the line electrode S32 to the capacitor electrode P32. The line electrode S31 is on a layer adjacent to the line electrode S32 and is connected to the line electrode S32 substantially in parallel therewith through the via electrodes V31 and V32 disposed therebetween. The inductor electrode of the third-stage LC parallel resonator is configured in a loop shape by including the via electrodes V31 and V32 and the line electrodes S31 and S32.

In this way, a laminate of a plurality of dielectric layers and a plurality of electrode layers is formed by lamination of a plurality of dielectric layers having various types of electrode layer patterns.

Of the above-described three LC parallel resonators, the first-stage LC parallel resonator corresponds to "first first-type LC parallel resonator" in the claims, and the third-stage LC parallel resonator corresponds to "second first-type LC parallel resonator" in the claims. The first-stage LC parallel resonator and the third-stage LC parallel resonator are not adjacent to each other on an equivalent circuit. The second-stage LC parallel resonator corresponds to "second-type LC parallel resonator" in the claims.

In reference to capacitor electrodes (first capacitor electrode and second capacitor electrode) of each of the LC parallel resonators, the direction in which the via electrodes V11 and V12 connecting the capacitor electrodes P11 and P12 and the line electrodes S11 and S12 of the first-stage LC parallel resonator extend from the capacitor electrodes P11 and P12 is opposite to the direction in which the via electrodes V21 and V22 connecting the capacitor electrodes P21 and P22 and the line electrodes S21 and S22 of the second-stage LC parallel resonator extend from the capacitor electrodes P21 and P22. Also, the direction in which the via electrodes V31 and V32 connecting the capacitor electrodes P31 and P32 and the line electrodes S31 and S32 of the third-stage LC parallel resonator extend from the capacitor electrodes P31 and P32 is opposite to the direction in which the via electrodes V21 and V22 connecting the capacitor electrodes P21 and P22 and the line electrodes S21 and S22 of the second-stage LC parallel resonator extend from the capacitor electrodes P21 and P22.

According to this structure, the jump-coupling capacitor electrodes P131 and P132 that generates jump-coupling capacitance between the first-stage and third-stage LC parallel resonators are distant in the lamination direction from the capacitor electrodes P21 and P22 of the second-stage LC parallel resonator, which is not related to the jump-coupling. Therefore, virtually no unnecessary stray capacitance occurs between the capacitor electrodes of the second-stage LC parallel resonator and the jump-coupling capacitor electrodes.

As illustrated in FIG. 3, the multilayer band-pass filter 101 includes input and output terminals on four side surfaces (end surfaces) of the laminate. The input and output terminals include ground terminals G1, G2, and G3, the unbalanced terminal UB, the balanced terminals B1 and B2, and vacant terminals NC1 and NC2. The ground terminals G1, G2, and G3 are electrically connected to lead electrodes EG1, EG2, and EG3 illustrated in FIG. 2, respectively. The unbalanced terminal UB is electrically connected to a lead electrode EU. The balanced terminals B1 and B2 are electrically connected to lead electrodes EB1 and EB2, respectively.

The dielectric-layer portion of each layer is low temperature co-fired ceramic (LTCC) having a dielectric constant in a range of from 6 to 80. Dielectric layers laminated on the electrode layers including the above-described line electrodes have a relative dielectric constant in a range of from 6 to 80. Dielectric layers on which the capacitor electrodes are disposed have a relative dielectric constant equal to or more than 20. Each of the dielectric layers can be made using low temperature co-fired ceramic formed from a glass component and at least one component of titanium oxide, barium oxide, alumina, and another material, for example. The above-described materials of each dielectric layer can apply to those in other preferred embodiments described below.

Referring to FIG. 4, the inductor L1 is an inductor including the via electrodes V11 and V12 and the line electrodes S11 and S12. The inductor L2 is an inductor including the via electrodes V21 and V22 and the line electrodes S21 and S22. The inductor L3 is an inductor including the via electrodes V31 and V32 and the line electrodes S31 and S32.

An inductor LU is an inductor including the inductor electrode S1 to perform matching at the unbalanced side.

The capacitors C11 and C12 are capacitors configured between the ground electrode GND and the capacitor electrodes P11 and P12. The capacitor C20 is a capacitor configured between the capacitor electrodes P21 and P22. The capacitors C31 and C32 are capacitors configured between the ground electrode GND and the capacitor electrodes P31 and P32.

A capacitor C131 is a capacitor configured between the jump-coupling capacitor electrode P131 and the capacitor electrodes P11 and P31. A capacitor C132 is a capacitor configured between the jump-coupling capacitor electrode P132 and the capacitor electrodes P12 and P32.

The above-described inductor L1 and the capacitors C11 and C12 define the first-stage LC parallel resonator. Similarly, the inductor L2 and the capacitor C20 define the second-stage LC parallel resonator, and the inductor L3 and the capacitors C31 and C32 define the third-stage LC parallel resonator.

As illustrated in FIG. 2, when the loop surfaces of the inductor electrodes including the via electrodes and the line electrodes are viewed in a direction in which the three inductor electrodes are arranged, the loop surfaces at least partially overlap each other. Therefore, inductive coupling (magnetic-field coupling) occurs between the inductor electrodes of adjacent LC parallel resonators. Because the inductor electrodes of the adjacent LC parallel resonators are near each other, capacitive coupling (electric-field coupling) occurs therebetween. A positional relationship of the inductor and the capacitors of the first-stage LC parallel resonator is opposite to that of the second-stage LC parallel resonator. Therefore, capacitive coupling between the first-stage and second-stage LC parallel resonators is larger than inductive coupling therebetween, and thus the first-stage and second-stage LC parallel resonators are capacitively coupled. Similarly, a positional relationship of the inductor and the capacitors of the second-stage LC parallel resonator is opposite to that of the third-stage LC parallel resonator. Thus, the second-stage and third-stage LC parallel resonators are capacitively coupled.

The capacitors C131 and C132 illustrated in FIG. 4 enable the first-stage and third-stage LC parallel resonators to be capacitively jump-coupled to each other.

Figure 5A:
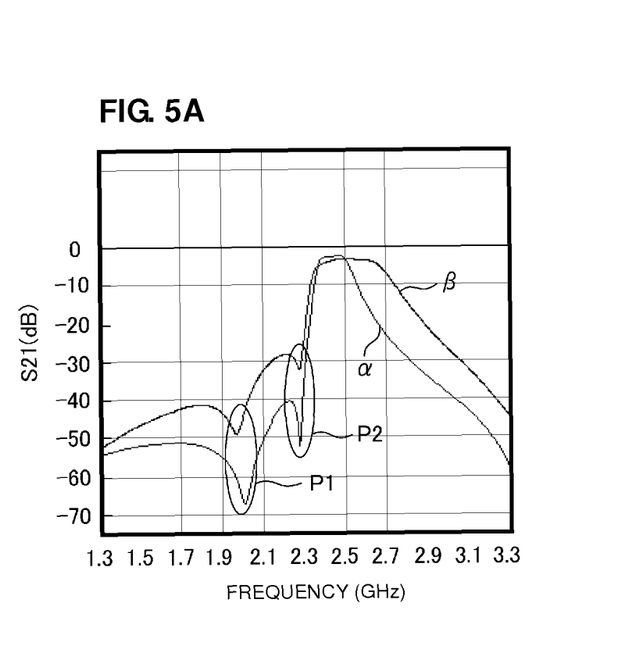
FIGS. 5A and 5B illustrate example characteristics of the multilayer band-pass filter according to the first preferred embodiment of the present invention and a traditional multilayer band-pass filter.
Figure 5B:
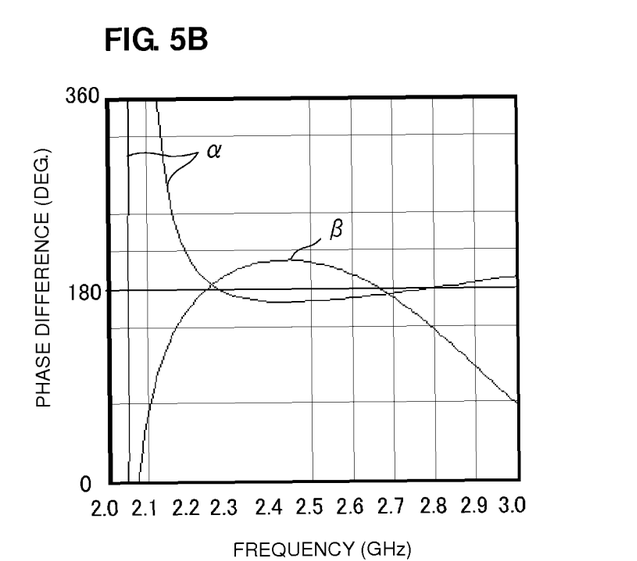

FIGS. 5A and 5B illustrate example characteristics of the multilayer band-pass filter 101 according to the first preferred embodiment and a comparative multilayer band-pass filter. FIG. 5A illustrates band-pass characteristics (s-parameter S21 characteristic) of the multilayer band-pass filters.

FIG. 5B illustrates characteristics of a phase difference between the balanced terminals B1 and B2. In FIGS. 5A and 5B, a curve α represents characteristics of the multilayer band-pass filter according to the first preferred embodiment, and a curve β represents characteristics of the comparative multilayer band-pass filter. For the comparative multilayer band-pass filter used here, the first-stage, second-stage, and third-stage LC parallel resonators have substantially the same positional relationship between the capacitor electrodes and the inductor electrode in FIG. 2. That is, when the connection between a capacitor electrode and a via electrode of each LC parallel resonator is a starting point, the via electrodes connecting the capacitor electrodes and the line electrodes in the three LC parallel resonators extend in substantially the same direction from the capacitor electrodes.

In FIG. 5A, an attenuation pole P1 results from jump-coupling between the first-stage and third-stage LC parallel resonators. An attenuation pole P2 results from coupling between the first-stage and second-stage LC parallel resonators and coupling between the second-stage and third-stage LC parallel resonators (each coupling being coupling between LC parallel resonators having opposite directions).

As illustrated in FIG. 5A, because parasitic capacitance between the capacitor electrodes of the second-stage LC parallel resonator and the jump-coupling capacitor electrodes in the multilayer band-pass filter according to the first preferred embodiment is small, the attenuations at the attenuation poles P1 and P2 of the curve α are larger than those of the curve β. Because a positional relationship of the capacitor electrodes and the inductor electrode of the second-stage LC parallel resonator is opposite to that of each of the first-stage and third-stage LC parallel resonators, coupling between the second-stage LC parallel resonator and each of the first-stage and third-stage LC parallel resonators can be capacitive coupling. This enables a multilayer band-pass filter that has a narrow pass band to be provided. Additionally, this results in a reduction in insertion loss of the multilayer band-pass filter.

As illustrated in FIG. 5B, at around 2.4 GHz corresponding to the pass band, the phase difference between the balanced terminals of the multilayer band-pass filter according to the first preferred embodiment is closer to 180 degrees than that of the traditional multilayer band-pass filter. Accordingly, the balance characteristics of the filter are improved.

Second Preferred Embodiment

Figure 6:
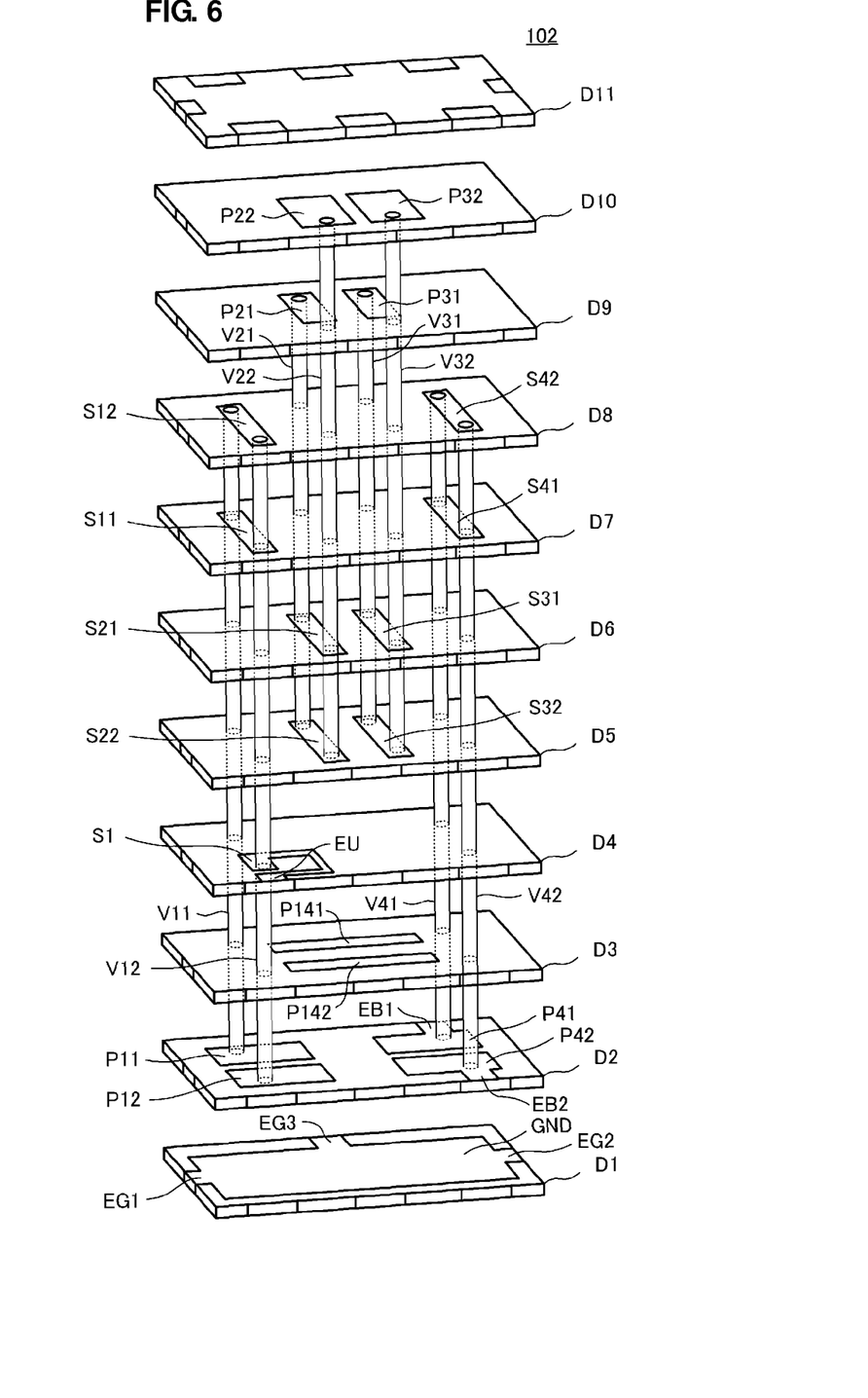
FIG. 6 is an exploded perspective view of a multilayer band-pass filter according to a second preferred embodiment of the present invention.
Figure 7:
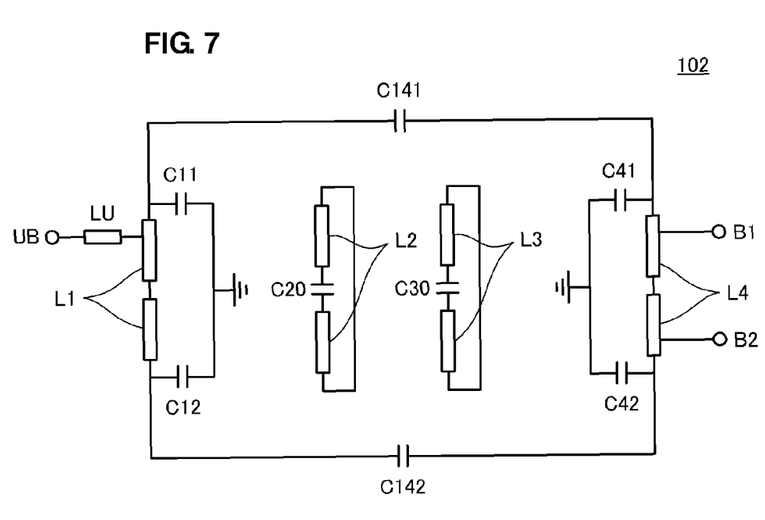
FIG. 7 is an equivalent circuit diagram of the multilayer band-pass filter according to the second preferred embodiment of the present invention.

FIG. 6 is an exploded perspective view of a multilayer band-pass filter 102 according to a second preferred embodiment of the present invention. FIG. 7 is an equivalent circuit diagram of the multilayer band-pass filter 102. The multilayer band-pass filter 101 according to the first preferred embodiment of the present invention includes three LC parallel resonators, whereas the multilayer band-pass filter 102 according to the second preferred embodiment of the present invention includes four LC parallel resonators.

Referring to FIG. 6, the line electrodes S32 and S31 of the third-stage LC parallel resonator are disposed on the upper surfaces of the dielectric layers D5 and D6, respectively. For the present preferred embodiment, of the four LC parallel resonators, the LC parallel resonator connected to an unbalanced terminal is defined as a first-stage LC parallel resonator, and the LC parallel resonator connected to the balanced terminals is defined as a fourth-stage LC parallel resonator. Of the remaining LC parallel resonators, the LC parallel resonator coupled to the first-stage LC parallel resonator is defined as a second-stage LC parallel resonator, and the LC parallel resonator coupled to the fourth-stage LC parallel resonator is defined as a third-stage LC parallel resonator.

The capacitor electrodes P31 and P32 of the third-stage LC parallel resonator are disposed on the upper surfaces of the dielectric layers D9 and D10, respectively. The via electrode V31 extends along the direction in which the dielectric layers D6 to D9 are laminated. The via electrode V32 extends along the direction in which the dielectric layers D6 to D10 are laminated.

Line electrodes S41 and S42 of the fourth-stage LC parallel resonator are disposed on the upper surfaces of the dielectric layers D7 and D8, respectively. Capacitor electrodes P41 and P42 of the fourth-stage LC parallel resonator are disposed on the upper surface of the dielectric layer D2. Via electrodes V41 and V42 extend along the direction in which the dielectric layers D3 to D8 are laminated. The line electrode S41 is on a layer adjacent to the line electrode S42 and is connected to the line electrode S42 substantially in parallel therewith through the via electrodes V41 and V42 disposed therebetween. Jump-coupling capacitor electrodes P141 and P142 are disposed on the upper surface of the dielectric layer D3. The other configuration is substantially the same as in the multilayer band-pass filter 101 according to the first preferred embodiment.

Of the above-described four LC parallel resonators, the first-stage LC parallel resonator corresponds to "first first-type LC parallel resonator" in the claims, and the fourth-stage LC parallel resonator corresponds to "second first-type LC parallel resonator" in the claims. The first-stage LC parallel resonator and the fourth-stage LC parallel resonator are not adjacent to each other on an equivalent circuit. The second-stage and third-stage LC parallel resonators correspond to "second-type LC parallel resonator" in the claims.

The direction in which the via electrodes connecting the capacitor electrodes and the line electrodes of the first-type LC parallel resonators extend from the capacitor electrodes is opposite to the direction in which the via electrodes connecting the capacitor electrodes and the line electrodes of the second-type LC parallel resonator extend from the capacitor electrodes.

According to this structure, the jump-coupling capacitor electrodes P141 and P142 forming jump-coupling capacitance between the first-stage and fourth-stage LC parallel resonators are distant in the lamination direction from the capacitor electrodes P21 and P22 of the second-stage LC parallel resonator, which is not related to this jump-coupling. Therefore, virtually no unnecessary stray capacitance occurs between the capacitor electrodes of the second-stage and third-stage LC parallel resonators and the jump-coupling capacitor electrodes.

FIG. 7 is an equivalent circuit diagram of the multilayer band-pass filter 102 according to the second preferred embodiment of the present invention.

The inductor L3 is an inductor including the via electrodes V31 and V32 and the line electrodes S31 and S32. An inductor L4 is an inductor including the via electrodes V41 and V42 and the line electrodes S41 and S42. A capacitor C30 is a capacitor configured between the capacitor electrodes P31 and P32. Capacitors C41 and C42 are capacitors configured between the ground electrode GND and the capacitor electrodes P41 and P42. A capacitor C141 is a capacitor configured between the jump-coupling capacitor electrode P141 and the capacitor electrodes P11 and P41. A capacitor C142 is a capacitor configured between the jump-coupling capacitor electrode P142 and the capacitor electrodes P12 and P42. The other configuration is substantially the same as in the multilayer band-pass filter according to the first preferred embodiment of the present invention.

The multilayer band-pass filter including the four LC parallel resonators described above can also achieve a configuration that has virtually no unnecessary parasitic capacitance occurring between a jump-coupling capacitor and a capacitor electrode of an LC parallel resonator that is not related to the jump-coupling.

For the present preferred embodiment of the present invention, even if a positional relationship between the capacitor electrodes and the inductor electrode of either one of the second-stage and third-stage LC parallel resonators is opposite to that of each of the first-stage and fourth-stage LC parallel resonators, an effect of suppressing parasitic capacitance is obtainable.

Third Preferred Embodiment

Figure 8:
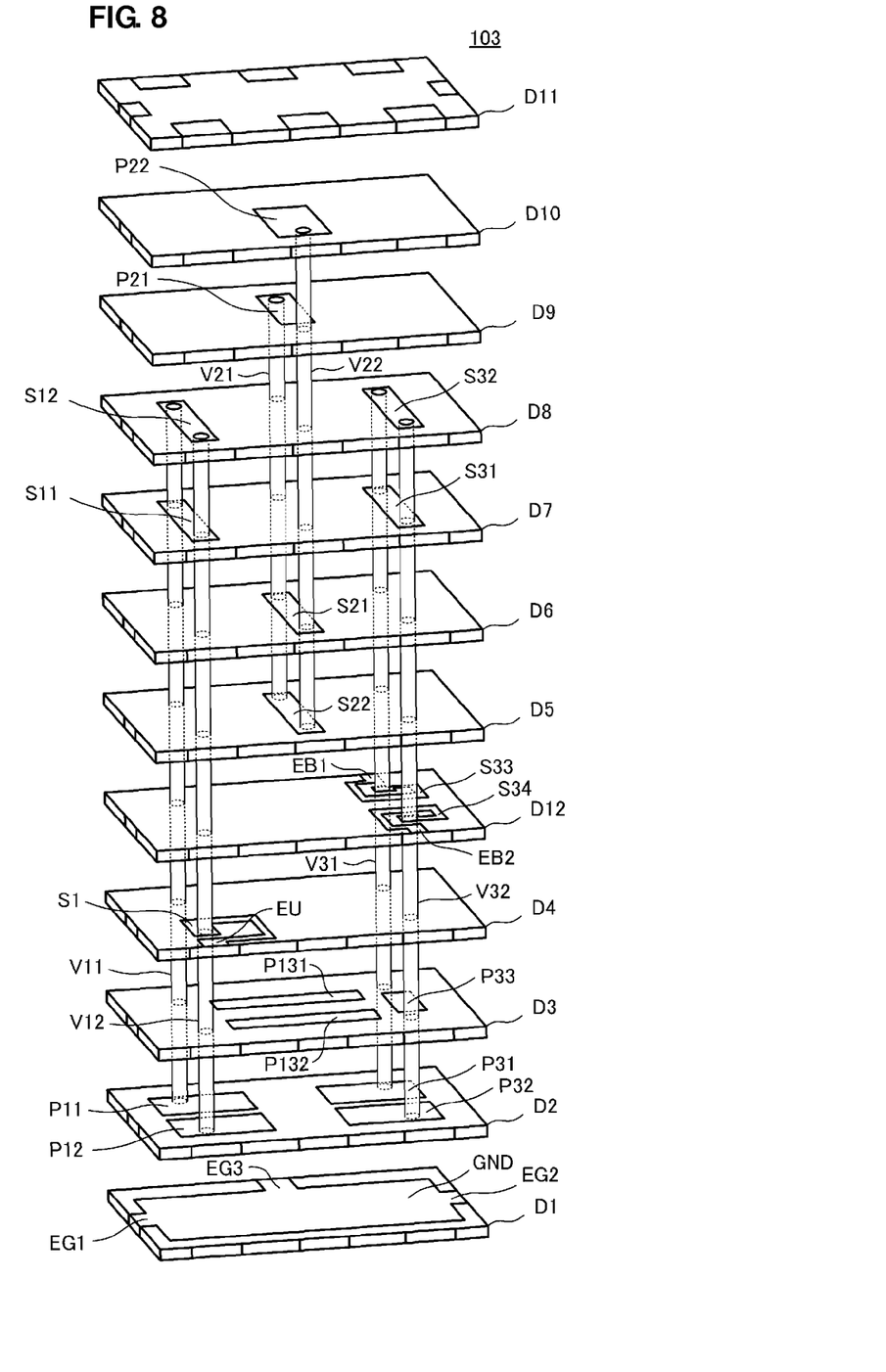
FIG. 8 is an exploded perspective view of a multilayer band-pass filter according to a third preferred embodiment of the present invention.

FIG. 8 is an exploded perspective view of a multilayer band-pass filter 103 according to a third preferred embodiment of the present invention. The multilayer band-pass filter 103 is different from the multilayer band-pass filter according to the first preferred embodiment of the present invention in that it includes a matching circuit at the balanced side.

Inductor electrodes S33 and S34 to perform matching at the balanced side are disposed on the upper surface of a dielectric layer D12. First ends of the inductor electrodes S33 and S34 to perform matching at the balanced side are electrically connected to the lead electrodes EB1 and EB2, respectively, and second ends thereof are electrically connected to the via electrodes V31 and V32, respectively.

A capacitor electrode P33 is disposed on the upper surface of the dielectric layer D3. The capacitor electrode P33 is opposed to the inductor electrodes S33 and S34 to perform matching at the balanced side and is arranged so as to extend across the gap therebetween.

The other configuration is substantially the same as in the multilayer band-pass filter illustrated in the first preferred embodiment of the present invention.

Figure 9:
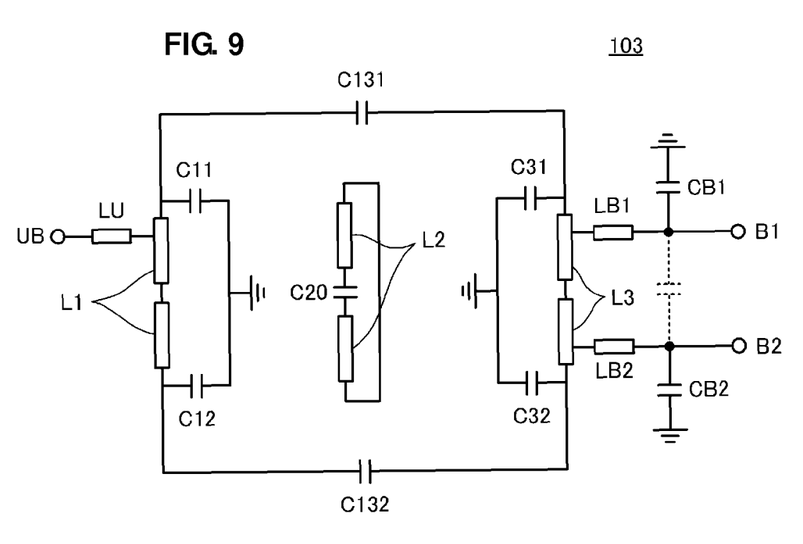
FIG. 9 is an equivalent circuit diagram of the multilayer band-pass filter according to the third preferred embodiment of the present invention.

FIG. 9 is an equivalent circuit diagram of the multilayer band-pass filter 103 according to the third preferred embodiment of the present invention.

Referring to FIG. 9, inductors LB1 and LB2 are inductors including the inductor electrodes S33 and S34 to perform matching at the balanced side. Capacitors CB1 and CB2 are the ones by which capacitance occurring between the capacitor electrode P33 and each of the capacitor electrodes P31 and P32 is symbolized. The capacitor CB1 and the capacitor CB2 preferably have the same or substantially the same capacitance. Capacitance occurring between the capacitor electrode P33 and each of the inductor electrodes S33 and S34 to perform matching at the balanced side is connected between the balanced terminals B1 and B2. Equivalently, this can mean that the capacitors CB1 and CB2 having capacitance substantially twice that of the above-described capacitor CB1 or the above-described capacitor CB2 are connected between the ground and each of the balanced terminals B1 and B2, as illustrated in FIG. 9. The output impedance of each of the balanced terminals B1 and B2 is adjustable by a change in a device value of at least one of the inductors LB1 and LB2 and the capacitors CB1 and CB2.

As described above, incorporating the matching circuit connected to the balanced terminals in the multilayer band-pass filter can achieve impedance-matching with a circuit connected to the balanced terminals B1 and B2 of the multilayer band-pass filter without an external matching circuit. This facilitates connection to a mother board or other substrates.

It is to be noted that, as illustrated in FIG. 8, because the inductor electrodes S33 and S34 to perform matching at the balanced side are disposed on the dielectric layer D12, which is different from the dielectric layers D5 to D10 on which the inductor electrode of the second-stage LC parallel resonator are disposed, the inductor electrodes S33 and S34 to perform matching at the balanced side do not affect coupling between the second-stage and third-stage LC parallel resonators.

Fourth Preferred Embodiment

Figure 10:
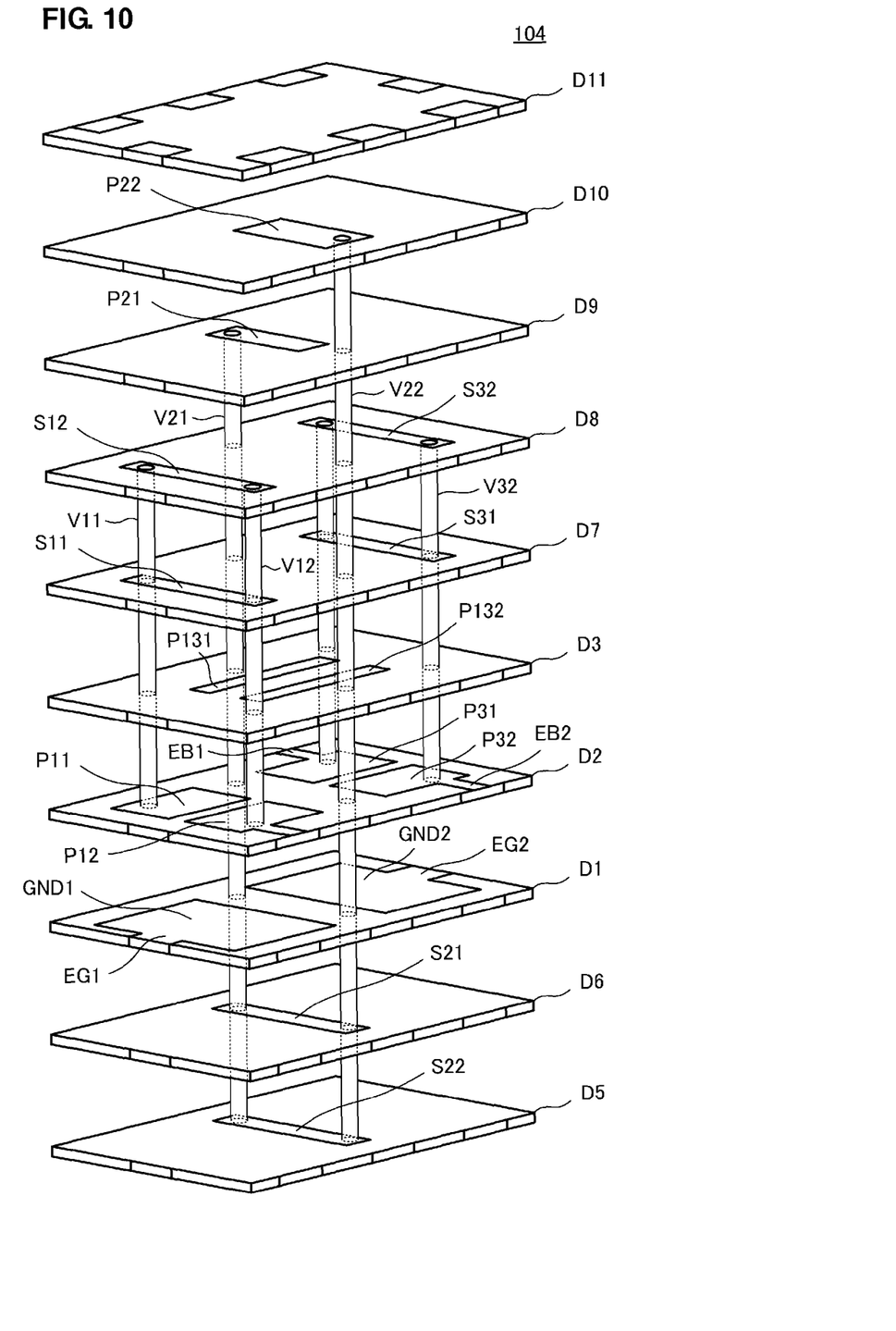
FIG. 10 is an exploded perspective view of a multilayer band-pass filter according to a fourth preferred embodiment of the present invention.

FIG. 10 is an exploded perspective view of a three-stage multilayer band-pass filter 104 according to a fourth preferred embodiment of the present invention. For the present preferred embodiment, as in the first preferred embodiment of the present invention, the LC parallel resonator connected to the unbalanced terminal is defined as a first-stage LC parallel resonator, the LC parallel resonator connected to the balanced terminals is defined as a third-stage LC parallel resonator, and the LC parallel resonator between the first-stage and third-stage LC parallel resonators is defined as a second-stage LC parallel resonator.

Ground electrodes GND1 and GND2 are disposed on the upper surface of the dielectric layer D1. The capacitor electrodes P11 and P12 of the first-stage LC parallel resonator and the capacitor electrodes P31 and P32 of the third-stage LC parallel resonator are disposed on the upper surface of the dielectric layer D2. The jump-coupling capacitor electrodes P131 and P132 are disposed on the upper surface of the dielectric layer D3. The line electrodes S22 and S21 of the second-stage LC parallel resonator are disposed on the upper surfaces of the dielectric layers D5 and D6, respectively. The line electrodes S11 and S12 of the first-stage LC parallel resonator are disposed on the upper surfaces of the dielectric layers D7 and D8, respectively. Similarly, the line electrodes S31 and S32 of the third-stage LC parallel resonator are disposed on the upper surfaces of the dielectric layers D7 and D8, respectively. The capacitor electrodes P21 and P22 of the second-stage LC parallel resonator are disposed on the upper surfaces of the dielectric layers D9 and D10, respectively.

The via electrodes V11, V12, V31, and V32 extend along the direction in which the dielectric layers D3, D7, and D8 are laminated. The via electrode V21 extends along the direction in which the dielectric layers D6, D1, D2, D3, D7, D8, and D9 are laminated. The via electrode V22 extends along the direction in which the dielectric layers D6, D1, D2, D3, D7, D8, D9, and D10 are laminated.

The via electrode V11 extends from the first end of the line electrode S12 to the capacitor electrode P11. The via electrode V12 extends from the second end of the line electrode S12 to the capacitor electrode P12. The line electrode S11 is on a layer adjacent to the line electrode S12 and is connected to the line electrode S12 substantially in parallel therewith through the via electrodes V11 and V12 disposed therebetween. The via electrodes V21 and V22 and the line electrodes S21 and S22 define the second-stage LC parallel resonator.

The other configuration is substantially the same as in the multilayer band-pass filter illustrated in the first preferred embodiment of the present invention.

As described above, the line electrodes S21 and S22 of the second-stage LC parallel resonator, which is not related to jump-coupling, may partially overlap the jump-coupling capacitor electrodes P131 and P132 and the ground electrodes GND1 and GND2 when viewed from a direction substantially perpendicular to the direction in which the dielectric layers are laminated.

When the line electrodes S21 and S22 are viewed in reference to the capacitor electrodes P21 and P22, i.e., when the direction in which the via electrodes V21 and V22 extend is viewed from the capacitor electrodes P21 and P22, the line electrodes S21 and S22 may be more distant than the capacitor electrodes P11, P12, P31, and P32 of the other LC parallel resonators (first-stage and third-stage LC parallel resonators) are.

With the fourth preferred embodiment of the present invention, because the proportion of the via electrodes in the inductor components of the second-stage LC parallel resonator is large, the Q value of the band-pass filter can be increased, and lower insertion loss characteristics are obtainable.

Fifth Preferred Embodiment

Figure 11A:
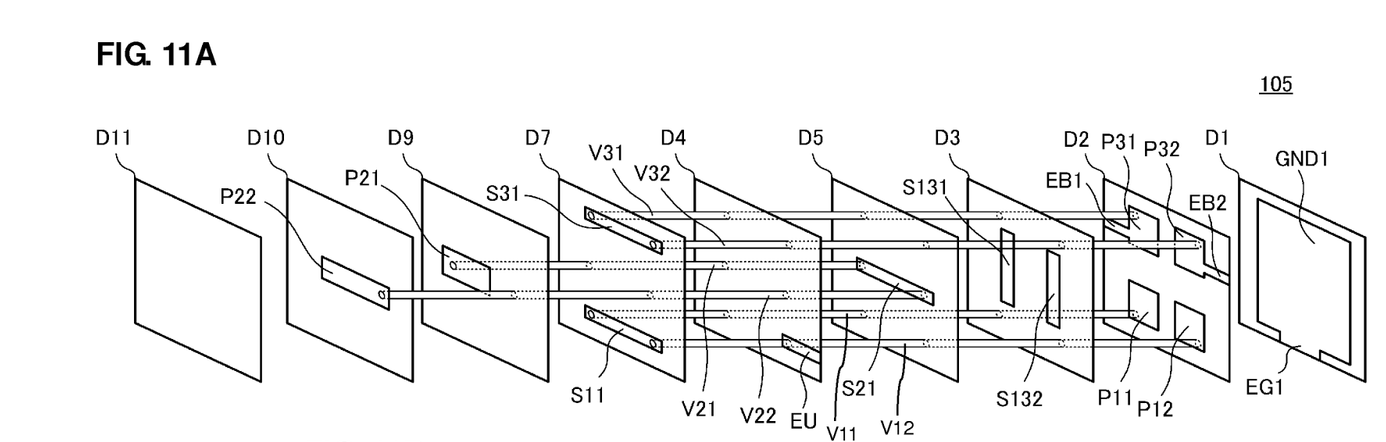
FIG. 11A is an exploded perspective view a multilayer band-pass filter according to a fifth preferred embodiment of the present invention.
Figure 11B:
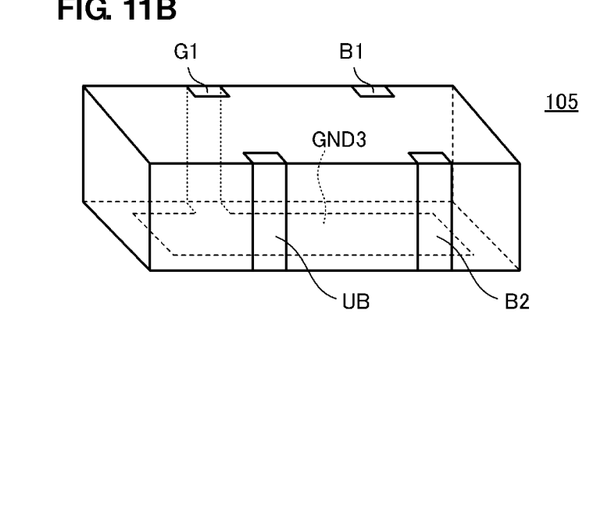
FIG. 11B is an external perspective view thereof.

FIG. 11A is an exploded perspective view of a multilayer band-pass filter 105 according to a fifth preferred embodiment, and FIG. 11B is an external perspective view thereof.

Unlike the first to fourth preferred embodiments of the present invention, the mounting surface of the multilayer band-pass filter according to the fifth preferred embodiment is substantially parallel with the direction in which the dielectric layers and the electrode layers are laminated.

For the present preferred embodiment, as in the first preferred embodiment of the present invention, the LC parallel resonator connected to the unbalanced terminal is defined as a first-stage LC parallel resonator, the LC parallel resonator connected to the balanced terminals is defined as a third-stage LC parallel resonator, and the LC parallel resonator between the first-stage and third-stage LC parallel resonators is defined as a second-stage LC parallel resonator.

The ground electrode GND1 is disposed on the dielectric layer D1. The capacitor electrodes P11 and P12 of the first-stage LC parallel resonator and the capacitor electrodes P31 and P32 of the third-stage LC parallel resonator are disposed on the dielectric layer D2. The jump-coupling capacitor electrodes P131 and P132 are disposed on the dielectric layer D3. The line electrode S21 of the second-stage LC parallel resonator is disposed on the upper surface of the dielectric layer D5. The line electrode S11 of the first-stage LC parallel resonator and the line electrode S31 of the third-stage LC parallel resonator are disposed on the dielectric layer D7. The capacitor electrodes P21 and P22 of the second-stage LC parallel resonator are disposed on the dielectric layers D9 and D10, respectively.

The via electrodes V11, V12, V31, and V32 extend along the direction in which the dielectric layers D3, D5, D4, and D7 are laminated. The via electrode V21 extends along the direction in which the dielectric layers D4, D7, and D9 are laminated. The via electrode V22 extends along the direction in which the dielectric layers D4, D7, D9, and D10 are laminated.

The via electrode V11 extends from a first end of the line electrode S11 to the capacitor electrode P11. The via electrode V12 extends from a second end of the line electrode S12 to the capacitor electrode P12. The via electrode V31 extends from a first end of the line electrode S31 to the capacitor electrode P31. The via electrode V32 extends from a second end of the line electrode S31 to the capacitor electrode P32. The via electrode V21 extends from a first end of the line electrode S21 to the capacitor electrode P21. The via electrode V22 extends from a second end of the line electrode S21 to the capacitor electrode P22.

The capacitor electrodes P11 and P12, the via electrodes V11 and V12, and the line electrode S11 define the first-stage LC parallel resonator. The capacitor electrodes P21 and P22, the via electrodes V21 and V22, and the line electrode S21 define the second-stage LC parallel resonator. The capacitor electrodes P31 and P32, the via electrodes V31 and V32, and the line electrode S31 define the third-stage LC parallel resonator.

As illustrated in FIG. 11B, the multilayer band-pass filter 105 includes input and output terminals on two side surfaces (end surfaces) of the laminate. The input and output terminals include the ground terminal G1, the unbalanced terminal UB, and the balanced terminals B1 and B2. The unbalanced terminal UB is electrically connected to the lead electrode EU illustrated in FIG. 11A. The balanced terminals B1 and B2 are electrically connected to the lead electrodes EB1 and EB2, respectively. A ground electrode GND3 is disposed on the lower surface of the laminate. The ground electrode GND3 is electrically connected to the ground electrode GND1 on the dielectric layer D1. For the multilayer band-pass filter 105, a surface on which the ground electrode GND3 is disposed is its mounting surface.

As described above, the loop surfaces of the plurality of LC parallel resonators may face a ground electrode substantially in parallel therewith. With this configuration, all the inductor electrodes of the LC parallel resonators have substantially the same distance between the ground electrode and each of the line electrodes and via electrodes defining the inductor electrodes. Accordingly, the impedance of each inductor can be easily designed, and stable characteristics are obtainable.

Sixth Preferred Embodiment

Figure 12:
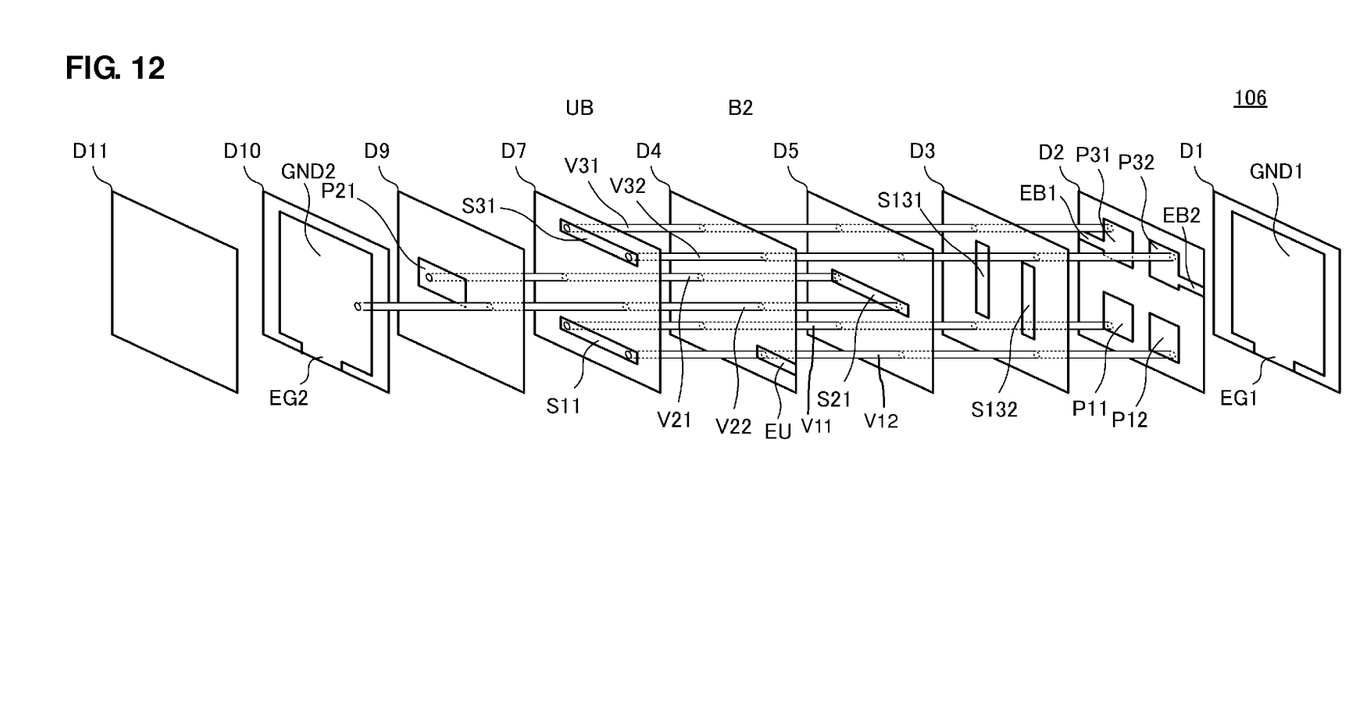
FIG. 12 is an exploded perspective view of a multilayer band-pass filter according to a sixth preferred embodiment.

FIG. 12 is an exploded perspective view of a multilayer band-pass filter 106 according to a sixth preferred embodiment of the present invention. In the multilayer band-pass filter 106, the ground electrode GND2 facing the capacitor electrode P21 is disposed on the dielectric layer D10. The ground electrode GND2 is electrically connected to the ground electrode GND3 being substantially parallel with the mounting surface as shown in FIG. 11B. The other configuration is substantially the same as in the multilayer band-pass filter illustrated in the fifth preferred embodiment of the present invention.

As described above, one of the capacitor electrodes of the second-stage LC parallel resonator, which is not related to jump-coupling, may be grounded. Surrounding the plurality of LC parallel resonators with the ground electrodes GND1, GND2, and GND3 reduces and minimizes the effects of electromagnetic radiation on the multilayer band-pass filter 106.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer band-pass filter comprising:
   a laminate including a plurality of dielectric layers and a plurality of electrode layers;
   a plurality of LC parallel resonators greater than two; and
   a jump-coupling capacitor electrode; wherein
   each of the plurality of LC parallel resonators includes a first capacitor electrode, a second capacitor electrode, and a loop-shaped inductor electrode disposed on the plurality of electrode layers;

the inductor electrode includes a first end connected to the first capacitor electrode and a second end connected to the second capacitor electrode, the first end defining a starting point and the second end defining an ending point;

the inductor electrode includes a line electrode disposed along any one of the plurality of dielectric layers and a via electrode extending in a direction in which the plurality of dielectric layers are laminated;

the plurality of LC parallel resonators includes a first first-type LC parallel resonator, a second first-type LC parallel resonator, and at least one second-type LC parallel resonator disposed between the first first-type LC parallel resonator and the second first-type LC parallel resonator;

the jump-coupling capacitor electrode is disposed on any one of the plurality of electrode layers and arranged to couple the first first-type LC parallel resonator and the second first-type LC parallel resonator;

the jump-coupling capacitor electrode faces at least one of the first capacitor electrode and the second capacitor electrode of each of the first first-type LC parallel resonator and the second first-type LC parallel resonator; and a direction in which the inductor electrode extends from the capacitor electrodes of each of the first-type LC parallel resonators is opposite to a direction in which the inductor electrode extends from the capacitor electrodes of the second-type LC parallel resonator.

2. The multilayer band-pass filter according to claim 1, wherein when viewed in a direction in which the plurality of LC parallel resonators are arranged, loop surfaces of the inductor electrodes of the plurality of LC parallel resonators at least partially overlap each other.

3. The multilayer band-pass filter according to claim 2, wherein each of the first first-type LC parallel resonator and the second first-type LC parallel resonator is connected to input and output electrodes, and the jump-coupling capacitor electrode is arranged between the capacitor electrodes of the first first-type LC parallel resonator and the capacitor electrodes of the second first-type LC parallel resonator and the line electrodes of the second-type LC parallel.

4. The multilayer band-pass filter according to claim 3, further comprising an impedance-matching inductor electrode disposed on any one of the plurality of electrode layers, wherein the second first-type LC parallel resonator and the balanced input and output electrode are connected to each other with the impedance-matching inductor electrode disposed therebetween, and the impedance-matching inductor electrode is disposed on a layer different from a layer on which the second-type LC parallel resonator is disposed.

5. The multilayer band-pass filter according to claim 1, wherein the laminate includes an unbalanced input and output electrode and a balanced input and output electrode, the first first-type LC parallel resonator is connected to the unbalanced input and output electrode, and the second first-type LC parallel resonator is connected to the balanced input and output electrode.

6. The multilayer band-pass filter according to claim 1, wherein the laminate further includes a ground electrode substantially parallel with the direction in which the dielectric layers are laminated and substantially parallel with a mounting surface, and the loop surfaces of the plurality of LC parallel resonators face the ground electrode substantially in parallel therewith.

* * * * *